(12) United States Patent
Schneider et al.

(10) Patent No.: US 12,068,519 B2
(45) Date of Patent: Aug. 20, 2024

(54) GYROMAGNETIC NONLINEAR TRANSMISSION LINE FOR RADIO FREQUENCY SIGNAL GENERATION AND PULSE COMPRESSION

(71) Applicant: Lawrence Livermore National Security, LLC, Livermore, CA (US)

(72) Inventors: Joseph Devin Schneider, Danville, CA (US); Alexander Adrian Baker, Livermore, CA (US); Jinkyu Han, San Ramon, CA (US); Lars F. Voss, Livermore, CA (US)

(73) Assignee: LAWRENCE LIVERMORE NATIONAL SECURITY, LLC, Livermore, CA (US)

( * ) Notice: Subject to any disclaimer, the term of this patent is extended or adjusted under 35 U.S.C. 154(b) by 0 days.

(21) Appl. No.: 17/556,575

(22) Filed: Dec. 20, 2021

(65) Prior Publication Data

US 2023/0198116 A1   Jun. 22, 2023

(51) Int. Cl.
*H01P 3/06* (2006.01)
*H01P 5/08* (2006.01)
(Continued)

(52) U.S. Cl.
CPC ............... *H01P 3/06* (2013.01); *H01P 5/085* (2013.01); *H01P 7/08* (2013.01); *H01P 11/005* (2013.01); *H03K 3/01* (2013.01)

(58) Field of Classification Search
CPC .... H01P 3/06; H01P 5/085; H01P 7/08; H01P 11/005; H01P 1/23; H01P 3/085; H03K 3/01; H03K 3/49; H03K 3/80
(Continued)

(56) References Cited

U.S. PATENT DOCUMENTS

| 6,980,068 | B2 * | 12/2005 | Miyazawa | ............... | H01P 1/047 333/260 |
| 10,263,565 | B2 | 4/2019 | Dolan et al. | | |
| 2018/0069289 | A1 | 3/2018 | Abraham et al. | | |

FOREIGN PATENT DOCUMENTS

| CN | 113394533 A | 9/2021 |
| JP | 2006005887 A | 1/2006 |

OTHER PUBLICATIONS

Machine English Translation of CN113394533A Published on Sep. 14, 2021 (Year: 2021).*

(Continued)

*Primary Examiner* — Rakesh B Patel
*Assistant Examiner* — Jorge L Salazar, Jr.
(74) *Attorney, Agent, or Firm* — Perkins Coie LLP

(57) ABSTRACT

Disclosed are non-linear transmission lines using ferromagnetic materials to generate ferromagnetic resonance oscillations. In one aspect, a non-linear transmission line apparatus is disclosed. The apparatus includes an outer conductor having a first side and a second internally facing side, and an inner conductor positioned internal to the non-linear transmission line apparatus. The apparatus further includes a ferromagnetic material surrounding the inner conductor, wherein the ferromagnetic material comprises nanoparticles of an ε-polymorph of iron oxide expressed as $\varepsilon\text{-}Fe_2O_3$. The apparatus also includes a first dielectric material positioned between the outer conductor and the inner conductor, the dielectric material in contact with both the ferromagnetic material and with the second internally facing side of the outer conductor, wherein the outer conductor, the inner conductor, the dielectric material and the ferromagnetic material form the nonlinear transmission line.

17 Claims, 7 Drawing Sheets

(51) Int. Cl.
*H01P 7/08* (2006.01)
*H01P 11/00* (2006.01)
*H03K 3/01* (2006.01)

(58) Field of Classification Search
USPC ..... 333/1, 160, 219.1, 219.2, 222, 238, 242, 333/243, 245, 246, 247
See application file for complete search history.

(56) References Cited

OTHER PUBLICATIONS

Fairbanks, Andrew J., et al., "A Review of Nonlinear Transmission Line System Design," IEEE Access, 2017.
Ulmasculov, MR, et al., "Gyromagnetic nonlinear transmission line generator of high voltage pulses modulated at 4 GHz frequency with 1000 Hz pulse repetition rate," J. Phys. Conf. Ser. 830.
International Search Report and Written Opinion dated Mar. 27, 2023 for International Patent Application No. PCT/US2022/082003 (10 pages).
Tucek, Jiri, et al., "ε-Fe2O3: An Advanced Nanomaterial Exhibiting Giant Coercive Field, Millimeter-Wave Ferromagnetic Resonance, and Magnetoelectric Coupling", Highlights of 2022, Chem. Mater, 22, 6483-6505, 2010.

* cited by examiner

| Material | $H_c$ (Oe) | $M_s$ | $K_1$ (J/cm³) | FMR freq (GHz) |
|---|---|---|---|---|
| Fair-Rite NiZn (52) | 0.6 | 2500 (Gauss) | 0.006 | 0.2 - 2 |
| YIG | ~0 | 1,780 (Gauss) | 0.00061 | 1 - 8 |
| LLNL ε – Fe₂O₃ | 4,000 - 20,800 | 9-15 (emu/g) | 0.2-0.5 | tunable (30-200) |

FIG. 6

GYROMAGNETIC NONLINEAR TRANSMISSION LINE FOR RADIO FREQUENCY SIGNAL GENERATION AND PULSE COMPRESSION

FEDERALLY SPONSORED RESEARCH OR DEVELOPMENT

This invention was made with Government support under Contract No. DE-AC52-07NA27344 awarded by the United States Department of Energy. The Government has certain rights in the invention.

TECHNICAL FIELD

The present disclosure relates to non-linear transmission lines for signal generation.

BACKGROUND

Short pulse, ultra-wide band (UWB) RF systems are of interest for a variety of potential applications. The high electric fields and broad spectral content of UWB systems allow users to take advantage of various coupling mechanisms. Modern Ka-band RF systems are dominated by vacuum electronics, specifically the portable traveling-wave tube (TWT) amplifiers. However, TWTs are not reliable as a short pulse, UWB amplifier. For at least this reason, there is a need for new implementations that can generate short bursts of RF oscillations.

SUMMARY

Disclosed are non-linear transmission lines using ferromagnetic materials to generate ferromagnetic resonance oscillations. In one aspect, a non-linear transmission line apparatus is disclosed. The apparatus includes an outer conductor having a first side and a second internally facing side, and an inner conductor positioned internal to the non-linear transmission line apparatus. The apparatus further includes a ferromagnetic material surrounding the inner conductor, wherein the ferromagnetic material comprises nanoparticles of an ε-polymorph of iron oxide expressed as $\varepsilon\text{-Fe}_2O_3$. The apparatus also includes a first dielectric material positioned between the outer conductor and the inner conductor, the dielectric material in contact with both the ferromagnetic material and with the second internally facing side of the outer conductor, wherein the outer conductor, the inner conductor, the dielectric material, and the ferromagnetic material form the nonlinear transmission line.

The following features can be included in various combinations. The non-linear transmission line is structured as a coaxial transmission line, and the outer conductor, the first dielectric material, and the ferromagnetic material are structured to be tubular in shape and the inner conductor is structured to be cylindrical in shape. The apparatus can further include a second outer conductor with a second side and a third internally facing side and/or a second dielectric material with a third side and a fourth side structured with the third side in contact with the third internally facing side of the second outer conductor, wherein the ferromagnetic layer is structured to be in contact with the fourth side of the second dielectric material. The non-linear transmission line is structured as a stripline transmission line, and the first and second outer conductors, the first and second dielectric material, and the ferromagnetic material are structured to be planar in shape and the inner conductor is structured to be cylindrical in shape. The non-linear transmission line is structured as a stripline transmission line, and wherein the first and second outer conductors, the first and second dielectric materials, and the ferromagnetic material are structured to be planar in shape and the inner conductor is structured to be planar in shape. The outer conductor and the inner conductor comprise gold, copper, or aluminum, or an alloy of two or more of gold, copper, and aluminum. The $\varepsilon\text{-Fe}_2O_3$ ferromagnetic material has a ferromagnetic resonance frequency between 30 and 200 GHz. The $\varepsilon\text{-Fe}_2O_3$ ferromagnetic material has an anisotropy constant, $K_1$, value of between 0.2-0.5, and wherein the $K_1$ value between 0.2-0.5 eliminates a requirement of an applied magnetic field, $H_{app}$.

In another aspect, a ferromagnetic resonant signal generator apparatus is disclosed. The apparatus includes an electrical input pulse generator that includes a switch configured to receive a high-voltage direct current voltage from a voltage source. The apparatus further includes a non-linear transmission line that includes at least two conductors that form a radio frequency or microwave transmission line, wherein the non-linear transmission line is configured to receive the electrical input pulse. Th non-linear transmission line further includes a ferromagnetic material comprising nanoparticles of an ε-polymorph of iron oxide expressed as $\varepsilon\text{-Fe}_2O_3$, wherein the at least two conductors and the ferromagnetic material are structured to generate ferromagnetic resonance signal in response to the electrical input pulse.

The following features can be included in various combinations. The high-voltage direct current voltage source produces between 1 kV and 10 kV. The switch comprises a photoconductive semiconductor switch (PCSS). The PCSS is turned-on by a pulse of light generated by a laser. The switch comprises an electrical semiconductor switch. The ferromagnetic resonance signal comprises oscillations with amplitude following an envelope. The oscillations have a frequency between 30 and 200 GHz, and the envelope has a Gaussian pulse shape. The apparatus can further include a load structured to receive the ferromagnetic resonance signal from the non-linear transmission line and to convert the ferromagnetic resonance signal to electromagnetic waves. The load can be an antenna. The $\varepsilon\text{-Fe}_2O_3$ ferromagnetic material has an anisotropy constant, $K_1$, value of between 0.2-0.5, and wherein the $K_1$ value between 0.2-0.5 eliminates a requirement of an applied magnetic field, $H_{app}$.

In another aspect, a method of manufacturing a non-linear transmission line is disclosed. The method includes depositing a first metal, depositing a first dielectric, depositing a portion of a ferromagnetic material, wherein the ferromagnetic material comprises nanoparticles of an ε-polymorph of iron oxide expressed as $\varepsilon\text{-Fe}_2O_3$. The method further includes depositing a second metal, depositing a remaining portion of the ferromagnetic material, depositing a second dielectric, and depositing a third metal. The following features can be included in various combinations. The non-linear transmission line is structured to be a stripline transmission line. The second metal layer is structured to be round in cross-sectional shape. The second metal layer is structured to be rectangular in cross-sectional shape. The ferromagnetic layer has a ferromagnetic resonance between 30 GHz and 200 GHz, and wherein the $\varepsilon\text{-Fe}_2O_3$ ferromagnetic material has an anisotropy constant, $K_1$, value of between 0.2-0.5.

BRIEF DESCRIPTION OF THE DRAWINGS

FIG. 6 depicts a comparison of ferromagnetic materials, in accordance with some example embodiments.

DETAILED DESCRIPTION

Figure 1:
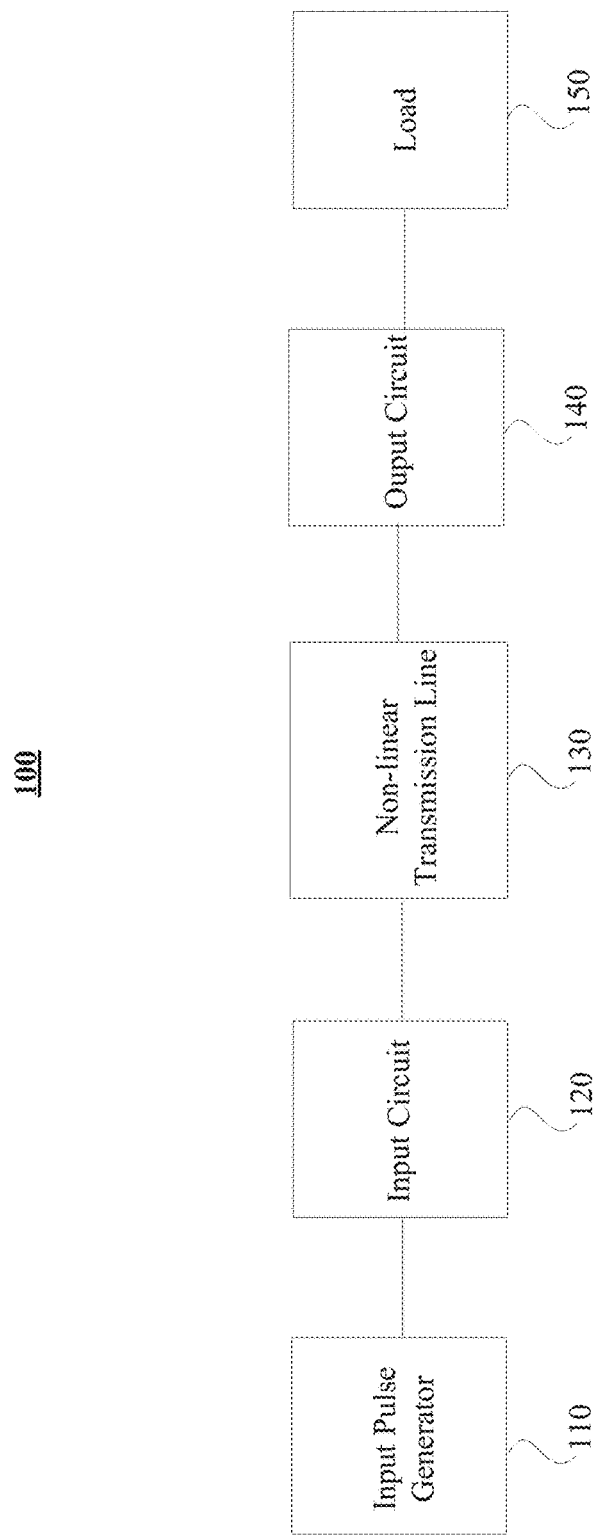
FIG. 1 shows a diagram of an example signal generator using a non-linear transmission line, in accordance with some example embodiments.

Magnetic materials with a large coercivity have many applications in science, industry, and medicine. For example, $\varepsilon$-Fe$_2$O$_3$ has a large coercive field at room temperature, significant ferromagnetic resonance, and coupled magnetoelectric features that are not observed in any other simple metal oxide phase of iron oxide. Moreover, the coercivity of the $\varepsilon$-Fe$_2$O$_3$ phase can be further increased by an alignment of its nanosized crystals (e.g., in the form of nanorods and/or nanowires) along a particular direction by applying an external magnetic field applied during the synthesis. More generally, there are four polymorphs of Fe$_2$O$_3$, labeled as $\alpha$-Fe$_2$O$_3$ (i.e., hematite), $\beta$-Fe$_2$O$_3$, $\gamma$-Fe$_2$O$_3$ (i.e., maghemite), and $\varepsilon$-Fe$_2$O$_3$. The $\varepsilon$-polymorph of Fe$_2$O$_3$ is not easy to fabricate in the form of bare nanosized objects, because of its significant thermal instability. Accordingly, special techniques are required to produce $\varepsilon$-Fe$_2$O$_3$ which is a dark brown magnetic phase of iron (III) oxide. From the crystallographic viewpoint, $\varepsilon$-Fe$_2$O$_3$ exhibits an orthorhombic noncentrosymmetric crystal structure with Fe atoms occupying four distinct nonequivalent crystallographic sites, including one tetrahedral site and three different octahedral sites.

A gyromagnetic-nonlinear transmission line (NLTL) is a transmission line filled with a ferrite that is used to generate RF oscillations or used for pulse compression. The operation of an NLTL is as follows; a short high voltage pulse is introduced on a center conductor of a NLTL which knocks the ferrite's magnetic moments off their easy axis, the magnetic moments then precess about the easy axis at the ferrite's ferromagnetic resonance (FMR) frequency, the magnetic field generated from this precession couples back into the center conductor thereby creating RF oscillations on-top of the initial pulse. The ferrites traditionally used in NLTLs are typically NiZn or YIG which are limited to sub-GHz output frequencies due to the fundamental material properties of those materials. Disclosed herein is a synthesized $\varepsilon$-Fe$_2$O$_3$ ferrite that is used in an NLTL. As a result, the $\varepsilon$-Fe$_2$O$_3$-based NLTL can produce oscillations between 30 GHz and 200 GHz.

Gyromagnetic NLTLs are transmission lines that use coherent magnetization precession to induce microwave oscillations. The frequency of the microwave oscillations is determined by the materials magnetic field dependent ferromagnetic resonance (FMR) frequency which is a function of its saturation magnetization (M$_S$) and the effective magnetic field (H$_{eff}$) inside the material. Many factors can contribute to H$_{eff}$, most importantly, the magneto-crystalline anisotropy (MCA) and the applied bias magnetic field (H$_{app}$). Here, for the purpose of demonstration, we assume that $\varepsilon$-Fe$_2$O$_3$ is a uniaxial ferrimagnet with MCA anisotropic energy given as:

$$U_{an} = K_1 \sin^2\theta \qquad \text{Equation 1,}$$

where U$_{an}$ is the MCA anisotropic energy, $\theta$ is the angle between the axis of anisotropy and the direction of steady magnetization and K$_1$ is the anisotropy constant. It can be shown that the equation for ferromagnetic resonance frequency in a sphere (i.e., a nano-particle) with uniaxial anisotropy is given as:

$$f^2 = \gamma^2/(2\pi)^2 [H_{app} + 2(K_1/M_s)\cos 2\theta_o][H_{app} + 2(K_1/M_s)\cos^2\theta_o] \qquad \text{Equation 2,}$$

where M$_s$ is the saturation magnetization, and $\gamma$ is the gyromagnetic ratio. This equation states that if K$_1$ is large enough, the FMR frequency can reach extremely high values without large values for H$_{app}$. In some example embodiments of the disclosed subject matter, H$_{app}$=0. For example, the disclosed LLNL $\varepsilon$-Fe$_2$O$_3$ ferromagnetic material produced with a sufficiently large K$_1$, such as having a value between 0.2-0.5, H$_{app}$ can have a value of zero. Not requiring an applied magnetic field, H$_{app}$, simplifies the system and reduces the const of the system because no H$_{app}$ magnetic field generation components are needed.

FIG. 1 depicts a diagram 100 showing an example signal generator using a non-linear transmission line (NLTL), in accordance with some example embodiments. Shown in FIG. 1 are input pulse generator 110, input circuit 120, non-linear transmission line 130, output circuit 140, and load 150.

Input pulse generator 110 generates an electrical input pulse. In some example embodiments, the generated input pulse has a peak voltage between about 1 kilovolts (kV) and 100 kV with a current up to 2000 Amps. The pulse can have a Gaussian pulse shape in time with a duration of between 20 picoseconds (ps) and about 10 nanoseconds (ns). In other example embodiments, other pulse shapes in time may be used such as a rectangular pulse, a cosine squared (raised cosine) pulse, a Dirac pulse, a sinc pulse, or another pulse shape. In some other example embodiments, the peak voltage and/or current may be lower (e.g., 50-250V, <1A). The pulse generator includes a circuit to generate the pulse. For example, the circuit may include a high-voltage direct current (DC) power supply such as a 1 kV or 10 kV power supply connected to a device operating as a switch with a turn-on time of about 10 ps to 1000 ns (e.g., 12 ps). For example, the switch can be an optically activated electrical switch where a pulse of light such as a laser pulse turns the switch on and off. In some other embodiments, the switch can be a semiconductor switch such as a transistor or field-effect transistor (FET), or metal oxide semiconductor FET (MOSFET), or other semiconductor device. The choice of which type of switch to use may depend on the peak voltage of the pulse generator and/or the power being passed through the switch to the input circuit and non-linear transmission line.

Input circuit 120 lies between the output of the input pulse generator 110 and the input to the non-linear transmission line 130. Input circuit 120 can include one or more linear transmission lines (i.e., standard transmission line referred to herein as a "transmission line."). For example, input circuit 120 can be a single short transmission that passes the generated input pulse from the input pulse generator 110 to the nonlinear transmission line 130. Or, the single transmission can be longer (e.g., centimeters to meters in length). In some example embodiments, the input circuit 120 can include other radio frequency (RF) or microwave (MW) components such as impedance matching circuits that can be implemented using transmission lines such as stub tuners, or include lumped elements such as inductors, capacitors and/or resistors. Input circuit 120 can also include devices such as RF/MW circulators, filters, amplifiers, power splitters, and/or resonators. In some example embodiments, input circuit 120 may be removed and input pulse generator 110 may connect directly to load non-linear transmission line 130.

Non-linear transmission line 130 lies between input circuit 120 and output circuit 140. The non-linear transmission lines disclosed here include a gyromagnetic nonlinear transmission line which is a transmission line filled with a ferrite material that is used to generate RF oscillations and/or used for pulse compression. The operation of an NLTL is as follows; a short high voltage pulse is introduced on the center conductor of the NLTL knocking the ferrites magnetic moments off their easy axis, the magnetic moments then precess about the easy axis at the ferrite's ferromagnetic resonance (FMR) frequency, the magnetic field generated from the precession couples back into the center conductor of the NLTL which creates RF oscillations on-top of the input pulse. The generated oscillations can have a frequency component as high as 200 GHz and the amplitude of the oscillations follows an envelope such as a Gaussian or other shape. The ferrite can be $\varepsilon\text{-Fe}_2O_3$. The NLTL can be configured as a traditional linear transmission line such as configured as a coaxial, stripline, or other transmission line with all or some of the material separating the transmission line conductors being the ferrite.

Output circuit 140 lies between the output of the non-liner transmission line 140 and the load 150. Output circuit 140 can include similar types of circuit elements to the circuit elements in the input circuit 120 such as one or more linear transmission lines, impedance matching circuits, RF/MW circulators, filters, amplifiers, power splitters, and/or resonators. For example, a high-pass filter may be used to pass the generated oscillations to the load and reject the input pulse. In some example embodiments, output circuit may be removed and non-linear transmission line 130 may connect directly to load 150.

Load 150 receives the generated oscillations within the envelope amplitude shape which may be superimposed on the input pulse shape. In some example embodiments, load 150 may be an antenna that couples the received electrical oscillations to electromagnetic waves that then propagate in free space including air and/or outer space, or another medium. In some embodiments, the load can dissipate or absorb a portion or all of the oscillations. For example, the oscillations may be dissipated in material to cause an effect on that material.

Figure 2:
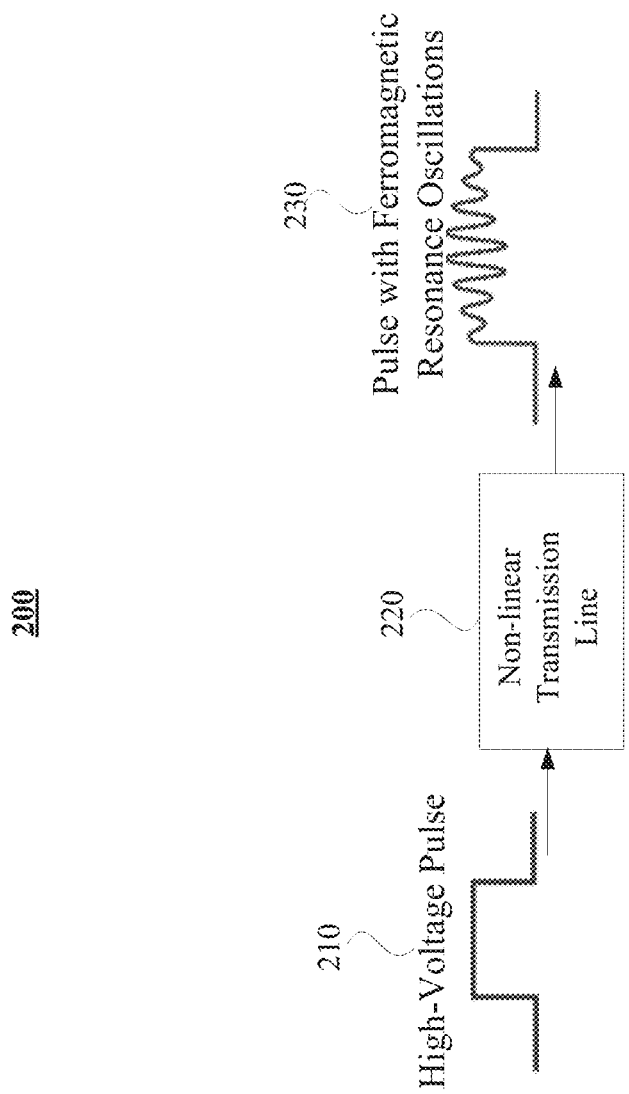
FIG. 2 shows a diagram of a non-linear transmission line for generating ferromagnetic resonance oscillations, in accordance with some example embodiments.

FIG. 2 depicts a schematic diagram 200 showing a non-linear transmission line for generating ferromagnetic resonance oscillations, in accordance with some example embodiments. In FIG. 2, high voltage pulse 210 is coupled to non-linear transmission line 220 which generates pulse with ferromagnetic oscillations 230 at the output of the non-linear transmission line. As detailed further in this patent document, the high-voltage input pulse 210 has a shape which at 210 is shown as a rectangular shape but can have other shapes instead of a rectangular shape. A pulse with ferromagnetic oscillations 230 is shown schematically at 230 as oscillations with amplitude following an envelope superimposed on the rectangular input pulse rectangular shape.

Figure 3:
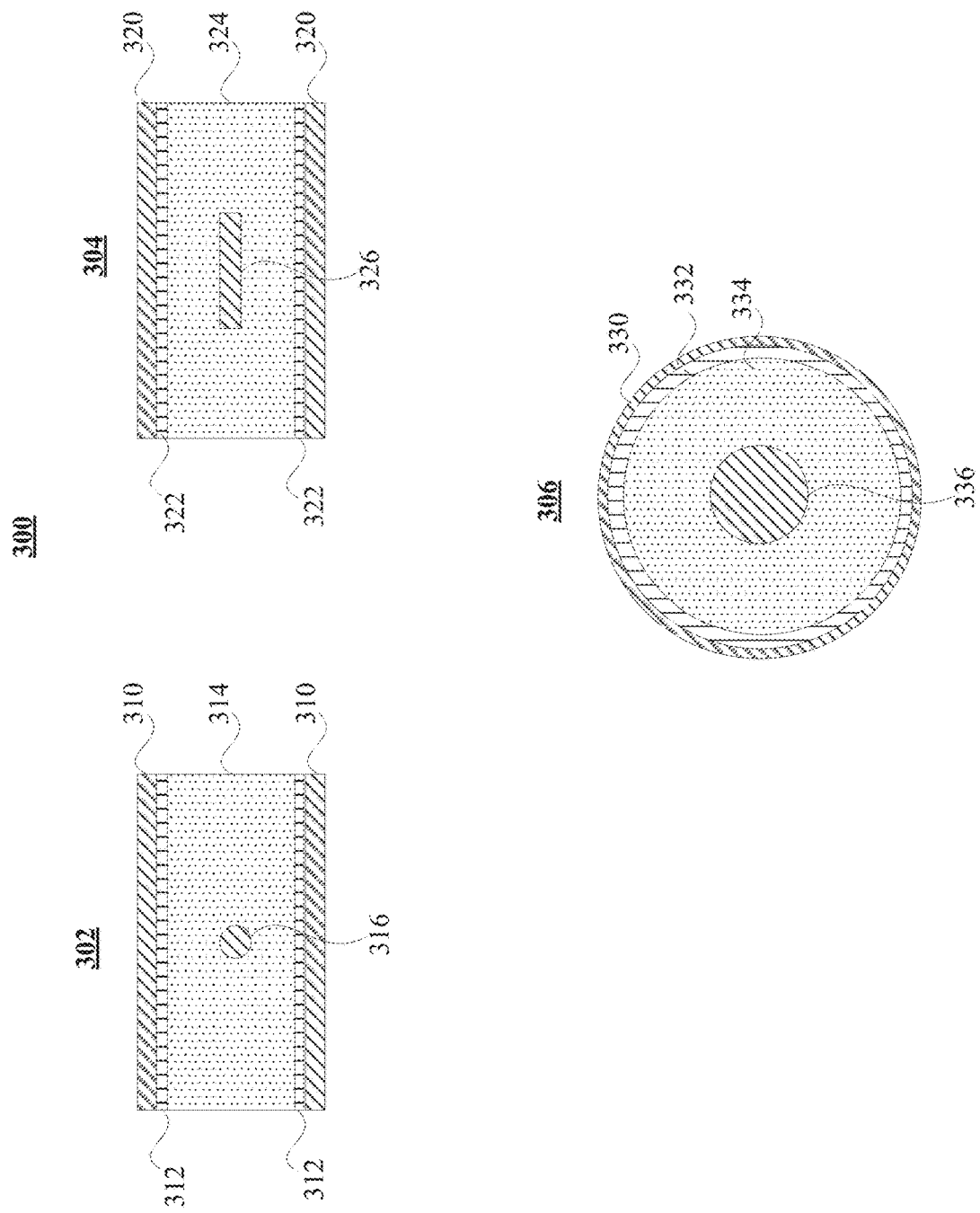
FIG. 3 depicts non-linear transmission line configurations, in accordance with some example embodiments.

FIG. 3 depicts schematic cross-sectional views of non-linear transmission line configurations 300, in accordance with some example embodiments. FIG. 3 shows stripline transmission line 302 with round center conductor, stripline configuration 302 with planar center conductor, and coaxial transmission line 306.

Stripline transmission line 302 includes planar metal layers 310. Each planar metal layer 310 has an adjacent dielectric material 312 on one side of the metal layer. The material chosen for the dielectric layers can be selected based on the dielectric constant of the material in order to produce a predetermined transmission line impedance. The material may also be selected based on loss properties (e.g., complex loss tangent) of the dielectric material at a predetermined frequency. For example, the dielectric material may be selected to have a high loss at undesired frequencies and to have a low loss at one or more desired frequencies such as the FMR oscillation frequency. The dielectric layers 312 have a dielectric constant that is material dependent. The material may be further selected based on its dielectric constant in order to produce a predetermined impedance based on a given device geometry. The dielectric material and the thickness of the dielectric material may be selected to prevent breakdown of the dielectric due to the high voltage input pulse. Ferromagnetic material 314 lies between the two dielectric layers 312. For example, ferromagnetic layer 314 may be the $\varepsilon\text{-Fe}_2O_3$ material made at LLNL and disclosed in this patent document. Round conductor 316 is embedded in the ferromagnetic layer 314. For example, the round center conductor 316 may be embedded at the center of ferromagnetic layer 314 (i.e., spaced equidistant from each dielectric layer 312). In some other embodiments, the round center conductor 316 may be embedded offset from the center of ferromagnetic layer 314 (i.e., spaced a different distance from one dielectric layer 312 from the other dielectric layer 312.). Metal layers 310 may one of many metals or an alloy of metals. The metals include gold, copper, aluminum, or other suitable metal or conductive material. The choice me material for the metal layers can be determined in part on the conductivity of the metal. Round conductor 316 can be the same conductive material as metal layers 310 or can be a different conductive material.

Stripline transmission line 304 includes planar metal layers 320 and dielectric layers 322 similar to stripline 302. Instead of the round conductor 316 shown in 302, stripline transmission line 304 has a center conductor 326 that is rectangular in cross-section. The cross-sectional shape of center conductor 326 may be square (not shown) or rectangular as shown. A square or rectangular may be easier to fabricate and may result in different breakdown properties than the round center conductor 316 at 302 due to the high-voltage pulse. For example, the sharp edges of the rectangular shape may cause breakdown at a lower high voltage than the a round cross-sectional shape.

Coaxial transmission line 306 includes metal layers 330 and 336 with round cross-sectional shapes. Metal layer 330 has a tubular shape and metal layer 336 has a cylindrical shape. On the interior side of metal layer 330 is dielectric layer 332. See the discussion above in the stripline 302 section regarding selection of the dielectric material. Between the dielectric layer 332 and the round center conductor 336 lies the ferromagnetic material 334. For example, ferromagnetic layer 314 may be the LLNL $\varepsilon\text{-Fe}_2O_3$ material disclosed in this patent document. Round center conductor 336 is embedded in center of the ferromagnetic layer 336. Metal layers 330 and 336 may one of many metals or an alloy of metals. As discussed above, the metals include gold, copper, aluminum, or other suitable metal or conductive material and the metal selection may be based on at least in the conductive properties of the metal, but also the cost and manufacturing compatibility with the fabrication of the rest of the NLTL.

Figure 4:
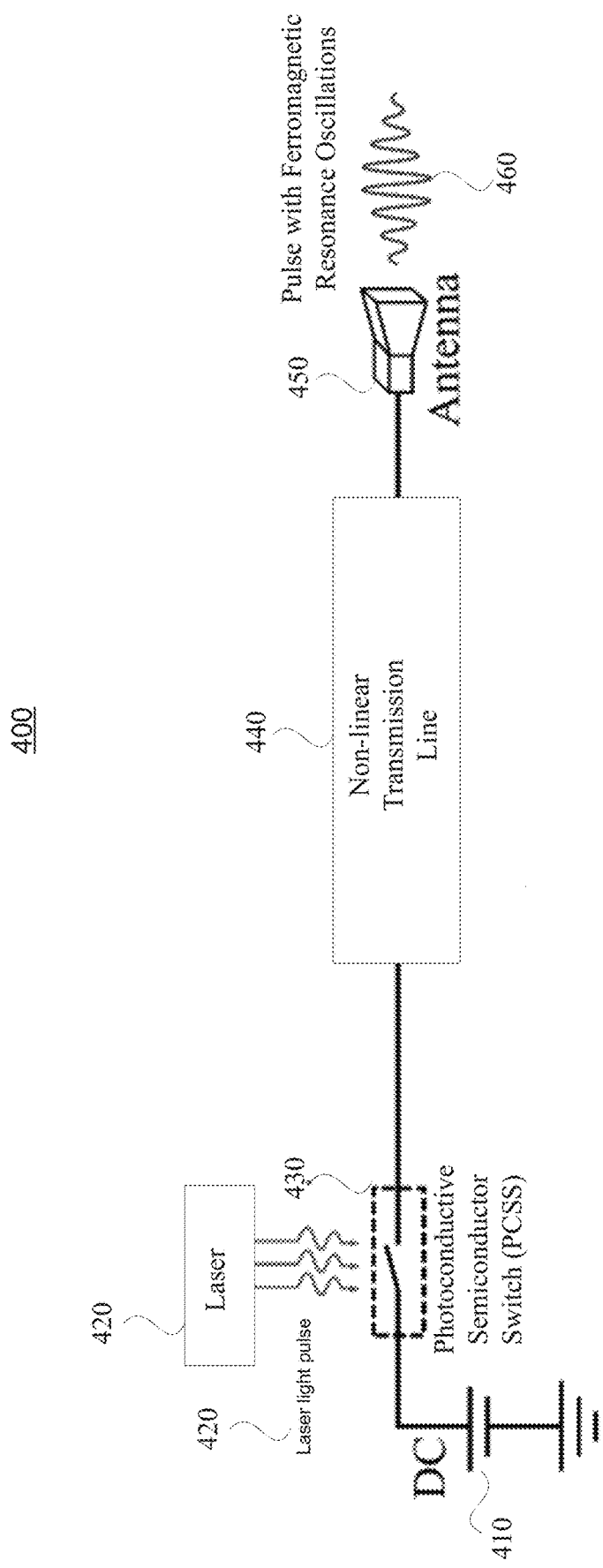
FIG. 4 depicts a system for generating ferromagnetic resonance oscillations, in accordance with some example embodiments.

FIG. 4 depicts a system 400 for generating ferromagnetic resonance oscillations, in accordance with some example embodiments. The description of FIG. 4 also refers to FIGS. 1 and 2. FIG. 4 includes DC voltage source 410, photoconductive semiconductor switch (PCSS) 430, laser 420 that generates laser light pulse 425, non-linear transmission line 440, and antenna 450 to transmit pulse with ferromagnetic oscillations 460.

FIG. 4 shows a short pulse RF system that integrates a PCSS with a NLTL. RF signals are generated by exciting the center conductor of the NLTL with a high voltage pulse which uniformly pushes the magnetization off axis. The magnetization then undergoes precession at the FMR frequency which couples back into the transmission line generating a short burst of an RF signal. State of the art NLTLs are limited to sub-10 GHz operation due to material limitations and the requirement for intense magnetic fields as shown in the above equation. Incorporating the disclosed $\varepsilon$-$Fe_2O_3$ into an NLTL, results in a much higher frequencies of operation.

Together DC voltage source 410, PCSS 430 and laser 420 perform the same or similar function to input pulse generator 110 shown in FIG. 1. DC voltage source 410 can be a high voltage source producing, in some implementations, 1 kV to 10 kV at a current of 1-10 Amps. In other embodiments, DC voltage source can produce lower voltages and currents (e.g. 50-250V, <1A). DC power source 410 is shown in FIG. 4 as a battery schematic symbol but in most applications is an AC-DC converter producing a DC voltage from an AC voltage, or a DC-DC producing a DC voltage from another DC voltage. The DC voltage source is connected to PCSS 430 which acts as a switch to selectively connect the DC voltage source 410 to the non-linear transmission line 440. The switching action of PCSS 430 is controlled by an optical input to the switch such laser light pulse 425 generated by laser 420. For example, a typical laser light pulse can have a duration of 700 ps but can range from about 20 ps up to several microseconds. Generally, the pulse shape is Gaussian although different pulse shapes can be used. PCSS 430 is turned on for a duration defined by the optical pulse width. Light generation by laser 420 can be controlled by a controller such as a microprocessor and memory with executable instructions determining when, for how long, and under what conditions the output pulses with ferromagnetic oscillations will be generated. Other types of switches can be used in place of PCSS 430 such as transistor switches, diode switches or other types of semiconductor switches.

Non-linear transmission line 440 is similar to that described with respect to 130 in FIG. 1, 220 in FIG. 2, and in FIG. 3. In the example of FIG. 4, no input circuit such as input circuit 110 or output circuit such as output circuit 140 as described with respect to FIG. 1 is included although an input circuit and/or output circuit could be added to perform various functions such as filtering, impedance matching, and so forth.

Antenna 450 is an example of the load 150 shown in FIG. 1. Antenna 450 can be any type of antenna such as a omnidirectional antenna, directional antenna such as a horn antenna (shown), dish antenna, antenna array, or other type of antenna. Antenna 450 converts the electrical pulse with ferromagnetic oscillations to propagating electromagnetic waves.

Figure 5:
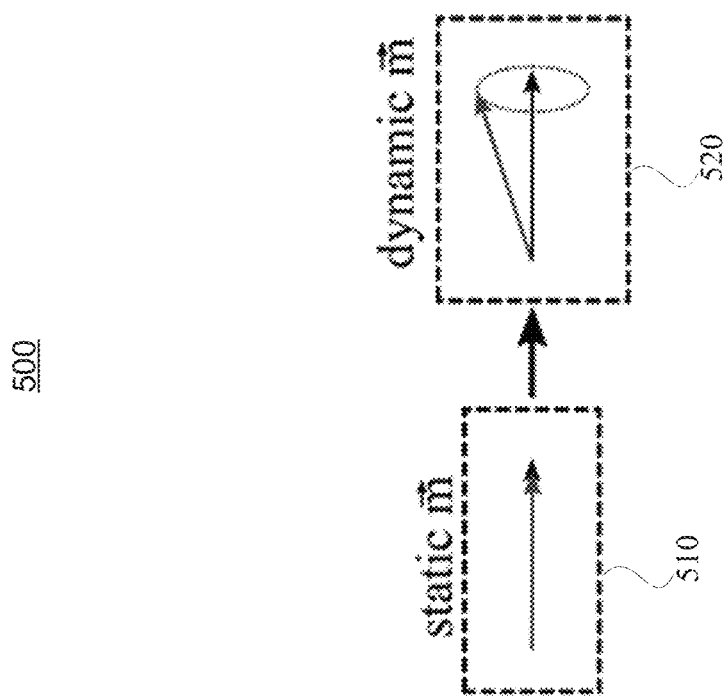
FIG. 5 depicts a schematic diagram showing the effect a high-voltage pulse on the magnetization of a ferromagnetic material, in accordance with some example embodiments.

FIG. 5 depicts a schematic diagram showing the effect a high-voltage pulse on the magnetization of a ferromagnetic material, in accordance with some example embodiments. Before the high-voltage pulse is applied to the ferromagnetic material, the magnetization 510 is static and in a single direction. The high-voltage pulse perturbs the magnetization 520 and causes the magnetization to precess at the ferromagnetic resonance frequency and has components in the original direction and in an orthogonal direction that rotates at the ferromagnetic resonance frequency.

FIG. 6 depicts a comparison of ferromagnetic materials, in accordance with some example embodiments. The table in FIG. 6 shows some properties of several materials that can be used in non-linear transmission lines including some material properties of $\varepsilon$-$Fe_2O_3$ (also referred to herein as LLNL $\varepsilon$-$Fe_2O_3$) produced at the Lawrence Livermore National Laboratory (LLNL) as well as some commercially available materials. The high coercive field (He) of the LLNL $\varepsilon$-$Fe_2O_3$ material allows for high frequency operation. Note that the $M_s$ units are different for the LLNL $\varepsilon$-$Fe_2O_3$ because the material is a powder whereas the other materials are solids and thus their volume can be easily determined. Note the high value for $K_1$ of the LLNL $\varepsilon$-$Fe_2O_3$ compared to the other materials. This high $K_1$ is usually only found in hard permeant rare earth magnets which are not suitable for an NLTL due to their high electric conductivity. Using Equation 2 with the LLNL $\varepsilon$-$Fe_2O_3$ material values, the FMR frequency ranges from 30 GHz to 200 GHz which is significantly higher than the 2 GHz FMR frequency for the other materials. Furthermore, using material synthesis, $K_1$ can be controlled to fit the frequency range of interest for a NLTL design. The coercive field of the LLNL $\varepsilon$-$Fe_2O_3$ material can be tuned during the manufacturing process. For example, the particle size and the phase purity of $\varepsilon$-$Fe_2O_3$ affects the coercive field of the material which can be changed via various synthetic conditions such as the nature of the iron precursor, the concentration of reagents to generate a silica matrix, pH for the precursor preparation, the concentration of $Ba^{2+}$ ions (or other dopants), annealing time, annealing temperature, and etching conditions (i.e., reaction temperature and the concentration of NaOH). For example, there is a specific temperature/time window that it is important to hit when synthesizing materials to achieve optimal properties. Too long leads to the formation of low-coercivity gamma phase, too short and the epsilon phase is not fully developed and both coercivity and magnetization suffer. The coercive field of the materials increase with increasing particle size and the purity of $\varepsilon$-$Fe_2O_3$. The coercive field can also be affected by particle shape/morphology.

The FMR frequency of the LLNL $\varepsilon$-$Fe_2O_3$ material can also be tuned during the manufacturing process. FMR frequency is proportional to coercive field and saturation magnetization of the materials and thus the synthetic parameters discussed above will affect the FMR of the material by changing the coercivity.

Figure 7:
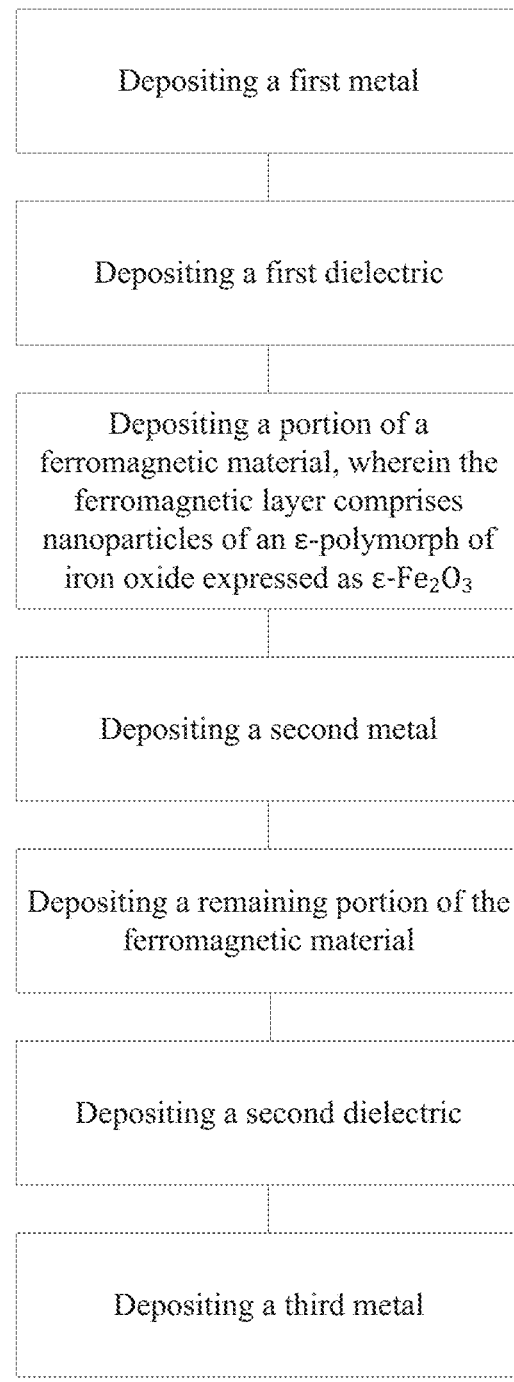
FIG. 7 depicts a process, in accordance with some example embodiments.

FIG. 7 depicts a method of manufacturing a non-linear transmission line, in accordance with some example embodiments. The method includes depositing a first metal, depositing a first dielectric, and depositing a portion of a ferromagnetic material, wherein the ferromagnetic material comprises nanoparticles of an $\varepsilon$-polymorph of iron oxide expressed as $\varepsilon$-$Fe_2O_3$. The process further includes depositing a second metal, depositing a remaining portion of the ferromagnetic material, depositing a second dielectric, and depositing a third metal.

Although a few variations have been described in detail above, other modifications or additions are possible. In particular, further features and/or variations may be provided in addition to those set forth herein. Moreover, the example embodiments described above may be directed to various combinations and subcombinations of the disclosed features and/or combinations and subcombinations of several further features disclosed above. In addition, the logic flow depicted in the accompanying figures and/or described herein does not require the particular order shown, or sequential order, to achieve desirable results. Other embodiments may be within the scope of the following claims.

Only a few implementations and examples are described and other implementations, enhancements and variations can be made based on what is described and illustrated in this patent document. Moreover, the separation of various system components in the embodiments described in this patent document should not be understood as requiring such separation in all embodiments.

What is claimed is:

1. A non-linear transmission line apparatus, comprising:
   an outer conductor having a first side and a second internally facing side;
   an inner conductor positioned internal to the non-linear transmission line apparatus;
   a ferromagnetic material surrounding the inner conductor, wherein the ferromagnetic material comprises nanoparticles of an ε-polymorph of iron oxide expressed as ε-$Fe_2O_3$ having an anisotropy constant, $K_1$, value of between 0.2-0.5, and wherein the $K_1$ value between 0.2-0.5 eliminates a requirement of an applied magnetic field, $H_{app}$; and
   a first dielectric material positioned between the outer conductor and the inner conductor, the first dielectric material in contact with both the ferromagnetic material and with the second internally facing side of the outer conductor, wherein the outer conductor, the inner conductor, the first dielectric material and the ferromagnetic material form the non-linear transmission line apparatus.

2. The non-linear transmission line apparatus of claim 1, wherein the non-linear transmission line apparatus is structured as a coaxial transmission line, and wherein the outer conductor, the first dielectric material, and the ferromagnetic material are structured to be tubular in shape and the inner conductor is structured to be cylindrical in shape.

3. The non-linear transmission line apparatus of claim 1, wherein the outer conductor and the inner conductor comprise gold, copper, or aluminum, or an alloy of two or more of gold, copper, and aluminum.

4. The non-linear transmission line apparatus of claim 1, wherein the ε-$Fe_2O_3$ ferromagnetic material has a ferromagnetic resonance frequency between 30 and 200 GHz.

5. A non-linear transmission line apparatus comprising:
   an outer conductor having a first side and a second internally facing side;
   an inner conductor positioned internal to the non-linear transmission line apparatus;
   a ferromagnetic material surrounding the inner conductor, wherein the ferromagnetic material comprises nanoparticles of an ε-polymorph of iron oxide expressed as ε-$Fe_2O_3$;
   a first dielectric material positioned between the outer conductor and the inner conductor, the first dielectric material in contact with both the ferromagnetic material and with the second internally facing side of the outer conductor;
   a second outer conductor with a second side and a third internally facing side; and
   a second dielectric material with a third side and a fourth side structured with the third side in contact with the third internally facing side of the second outer conductor,
   wherein the outer conductor, the second outer conductor, the inner conductor, the first dielectric material, the second dielectric material, and the ferromagnetic material form the non-linear transmission line apparatus,
   wherein the ferromagnetic material is structured to be in contact with the fourth side of the second dielectric material.

6. The non-linear transmission line apparatus of claim 5, wherein the non-linear transmission line apparatus is structured as a stripline transmission line, and wherein the outer conductor and the second outer conductor, the first and second dielectric material, and the ferromagnetic material are structured to be planar in shape and the inner conductor is structured to be cylindrical in shape.

7. The non-linear transmission line apparatus of claim 5, wherein the non-linear transmission line apparatus is structured as a stripline transmission line, and wherein the outer conductor and second outer conductor, the first and second dielectric materials, and the ferromagnetic material are structured to be planar in shape and the inner conductor is structured to be planar in shape.

8. A ferromagnetic resonant signal generator apparatus, comprising:
   an electrical input pulse generator comprising:
      a switch configured to receive a high-voltage direct current voltage from a voltage source; and
      a non-linear transmission line comprising:
         at least two conductors that form a radio frequency or microwave transmission line, wherein the non-linear transmission line is configured to receive an electrical input pulse; and
         a ferromagnetic material comprising nanoparticles of an ε-polymorph of iron oxide expressed as ε-$Fe_2O_3$, wherein the at least two conductors and the ferromagnetic material are structured to generate ferromagnetic resonance signal in response to the electrical input pulse.

9. The ferromagnetic resonant signal generator apparatus of claim 8, wherein the ε-$Fe_2O_3$ ferromagnetic material has an anisotropy constant, $K_1$, value of between 0.2-0.5, and wherein the $K_1$ value between 0.2-0.5 eliminates a requirement of an applied magnetic field, $H_{app}$.

10. The ferromagnetic resonant signal generator apparatus of claim 8, wherein the high-voltage direct current voltage produced from the voltage source is between 1 kV and 10 kV.

11. The ferromagnetic resonant signal generator apparatus of claim 8, wherein the switch comprises a photoconductive semiconductor switch (PCSS).

12. The ferromagnetic resonant signal generator apparatus of claim 11, wherein the PCSS is turned-on by a pulse of light generated by a laser.

13. The ferromagnetic resonant signal generator apparatus of claim 8, wherein the switch comprises an electrical semiconductor switch.

14. The ferromagnetic resonant signal generator apparatus of claim 8, wherein the ferromagnetic resonance signal comprises oscillations with amplitude following an envelope.

15. The ferromagnetic resonant signal generator apparatus of claim 14, wherein the oscillations have a frequency between 30 and 200 GHz, and the envelope has a Gaussian pulse shape.

16. The ferromagnetic resonant signal generator apparatus of claim 8, further comprising:
   a load structured to receive the ferromagnetic resonance signal from the non-linear transmission line and to convert the ferromagnetic resonance signal to electromagnetic waves.

17. The ferromagnetic resonant signal generator apparatus of claim 16, wherein the load is an antenna.

* * * * *